(12) United States Patent
Delapierre

(10) Patent No.: US 6,828,640 B2
(45) Date of Patent: Dec. 7, 2004

(54) INTEGRATED ELECTROMECHANICAL MICROSTRUCTURE COMPRISING PRESSURE ADJUSTING MEANS IN A SEALED CAVITY AND PRESSURE ADJUSTMENT PROCESS

(75) Inventor: Gilles Delapierre, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/685,573

(22) Filed: Oct. 16, 2003

(65) Prior Publication Data

US 2004/0080035 A1 Apr. 29, 2004

(30) Foreign Application Priority Data

Oct. 24, 2002 (FR) ............................................. 02 13325

(51) Int. Cl.⁷ ............................................. H01L 29/84
(52) U.S. Cl. ....................... 257/420; 257/414; 257/415; 438/50
(58) Field of Search ................................. 257/414–420, 257/528; 438/50–53, 329, 379

(56) References Cited

U.S. PATENT DOCUMENTS

| | | | |
|---|---|---|---|
| 5,610,438 A | | 3/1997 | Wallace et al. ............. 257/682 |
| 6,025,767 A | * | 2/2000 | Kellam et al. .............. 335/128 |
| 6,247,485 B1 | * | 6/2001 | Rossi et al. .............. 137/68.13 |
| 6,413,848 B1 | * | 7/2002 | Giust et al. .................. 438/601 |

FOREIGN PATENT DOCUMENTS

| WO | WO 98/26443 | 6/1998 |
|---|---|---|
| WO | WO 98/37392 | 8/1998 |

OTHER PUBLICATIONS

Casiday et al., "Gas Laws Save Lives: The Chemistry Behind Airbags", Oct. 2000, Washington University St. Louis, http://www.chemistry.wustl.edu/~edudev/Labtutorials/Airbags/airbags.html.*

* cited by examiner

Primary Examiner—Nathan J. Flynn
Assistant Examiner—Scott R. Wilson
(74) Attorney, Agent, or Firm—Oliff & Berridge, PLC

(57) ABSTRACT

The integrated electromechanical microstructure comprises a base substrate and a cavity closed by a protective cover. Means for adjusting the pressure in the cavity after the protective cover has been sealed comprise at least one element made of pyrotechnic material combustion whereof releases gas into the cavity. The pressure in the cavity can thus be adjusted independently from the sealing process. Selective ignition of the elements made of pyrotechnic material can be achieved by heating electrical resistors or by laser beams coming from outside the microstructure and directed selectively towards the elements made of pyrotechnic material through a transparent zone of the protective cover.

9 Claims, 2 Drawing Sheets

INTEGRATED ELECTROMECHANICAL MICROSTRUCTURE COMPRISING PRESSURE ADJUSTING MEANS IN A SEALED CAVITY AND PRESSURE ADJUSTMENT PROCESS

BACKGROUND OF THE INVENTION

The invention relates to an integrated electromechanical microstructure comprising a base substrate and a cavity closed by a protective cover, and a process for adjusting the pressure in the cavity.

STATE OF THE PRIOR ART

Integrated electromechanical microstructures or MEMS (Micro Electro-Mechanical Systems) using manufacturing processes stemming from micro-electronics are increasingly used, in particular for manufacturing accelerometers, gyrometers for navigation and RF or optic switches for telecommunications.

As represented schematically in FIG. 1, such a microstructure conventionally comprises a base substrate 1. The mobile mechanical elements 2 of the microstructure are arranged in a microcavity 3. The latter is closed by a protective cover 4 by means of a peripheral sealing seam 5. To reduce costs, several microstructures are generally manufactured simultaneously and a protective cover common to all the microstructures is sealed before the different microstructures are cut off.

The performances of the mechanical elements of the microstructures, such as the thermal noise, damping or passband, depend directly on the gaseous environment surrounding these elements inside the cavity 3. In current manufacturing processes, the pressure inside the cavity 3 is fixed by the surrounding pressure at the time sealing is performed. The final atmosphere inside the cavity is in fact related to the sealing process and, when several microstructures are manufactured simultaneously, it is necessarily identical in all the cavities. Moreover, it is set once and for all, depends on the sealing temperature due to the law of perfect gases, and can be polluted by degassing of the materials when sealing is performed.

It may be desired to control the atmosphere inside the cavity 3 fairly closely. It may for example be required to create a vacuum in the cavity to have a low noise or very sharp resonance peaks, or to have a pressure of a few bars for high damping and very low cut-off frequencies.

In certain cases, a sealing process in two stages is used: after the cover 4, which is initially provided with a hole, has been sealed, the pressure is set to the required value and the hole is filled. This relatively complex process does not however give total satisfaction.

OBJECT OF THE INVENTION

The object of the invention is to overcome these shortcomings and more particularly to make control of the pressure in the cavity of an integrated electromechanical microstructure easier.

According to the invention, this object is achieved by the fact that the microstructure comprises pressure adjusting means comprising at least one element made of pyrotechnic material, combustion whereof releases gas into the cavity so as to adjust the pressure in the cavity after the protective cover has been sealed.

The pressure in the cavity can thereby be defined independently from the sealing process and the pressure in each already sealed component can be adjusted individually.

The element made of pyrotechnic material can be arranged in the cavity or in an additional cavity formed in the protective cover, a micro-orifice of the protective cover joining the two cavities.

An object of the invention is also to provide a process for adjusting the pressure in the cavity of a microstructure comprising ignition of at least one element made of pyrotechnic material after the protective cover closing the cavity has been sealed.

BRIEF DESCRIPTION OF THE DRAWINGS

Other advantages and features will become more clearly apparent from the following description of particular embodiments of the invention, given as non-restrictive examples only and represented in the accompanying drawings, in which.

DESCRIPTION OF PARTICULAR EMBODIMENTS

According to the invention, the microstructure comprises at least one element made of pyrotechnic material, combustion whereof releases gas into the cavity 3 after the protective cover 4 has been sealed. The quantity of gas released by combustion corresponds to the pressure required inside the cavity.

Figure 1:
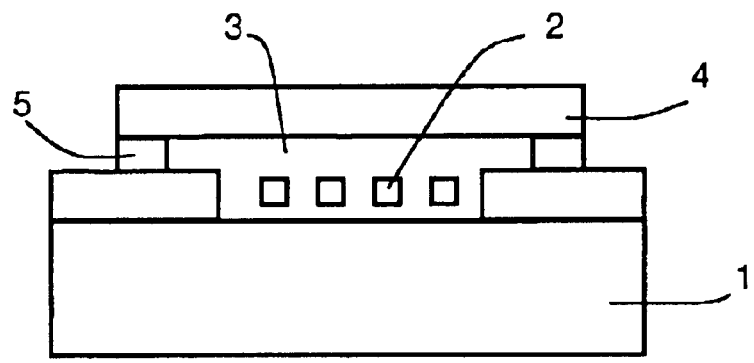
FIG. 1 is a schematic representation of a microstructure according to the prior art.
Figure 2:
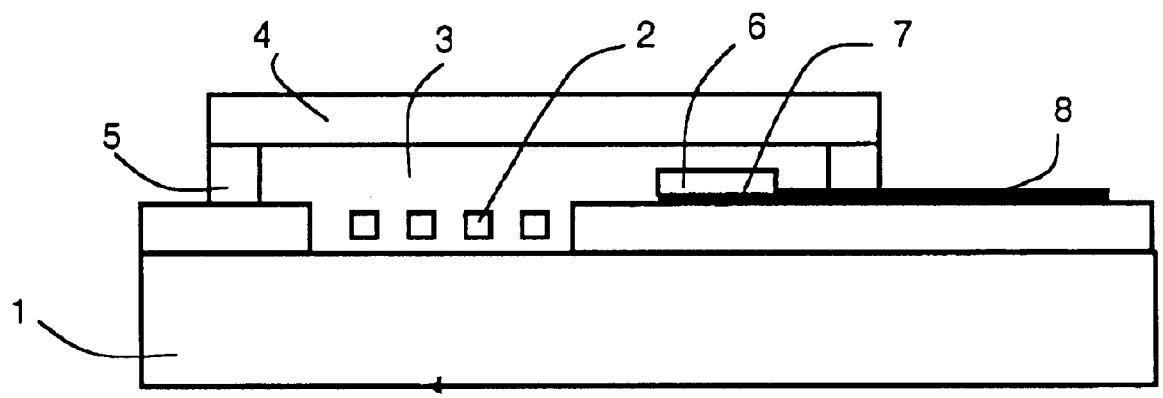
FIG. 2 represents a first embodiment of a microstructure according to the invention.

In a first embodiment, illustrated in FIG. 2, an element 6 made of pyrotechnic material is arranged inside the cavity 3. The pyrotechnic material constituting the element 6 can be deposited on an electrical resistor 7 directly formed on the base substrate 1 inside the cavity 3. The electrical resistor 7 is connected to external electrical terminals 8. After the cavity has been sealed, applying an electrical voltage between the external electrical terminals 8 causes heating of the resistor 7 by Joule effect and ignition of the element 6 made of pyrotechnic material. Combustion of the latter causes release of a preset quantity of gas, enabling the pressure inside the cavity 3 to be adjusted to a preset value.

The pressure can be generated in several steps from a multitude of elements 6, or micro-cells, made of pyrotechnic material, able to be ignited selectively and/or sequentially. The elements 6 can comprise different quantities of pyrotechnic material so as to enable a more or less fine adjustment of the pressure in the cavity. Selective and sequential ignition of the different elements can be achieved by any suitable means. Each element 6 can notably be associated with a corresponding electrical resistor 7. An external control circuit (not shown) selectively applies a voltage to the terminals of one of the resistors for ignition of the corresponding element.

In an alternative embodiment, ignition of an element 6 is caused by a laser beam coming from outside the microstructure and directed towards the element made of pyrotechnic material through a zone of the cover 4 transparent at the wavelength of the laser beam.

Figure 3:
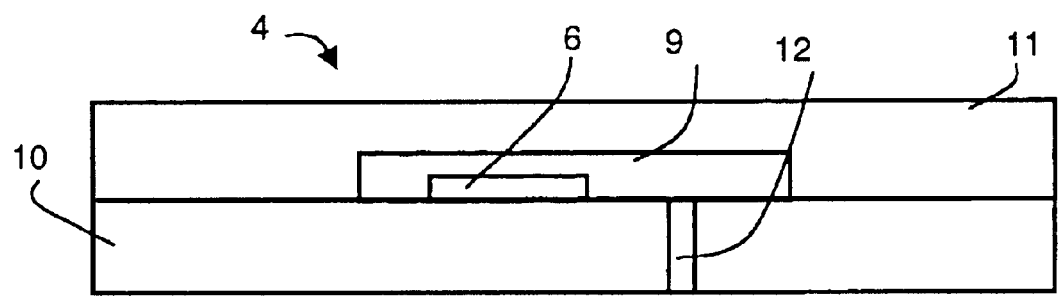
FIGS. 3 and 4 respectively represent a cover and the microstructure whereon this cover is affixed in a second embodiment of the invention.
Figure 4:
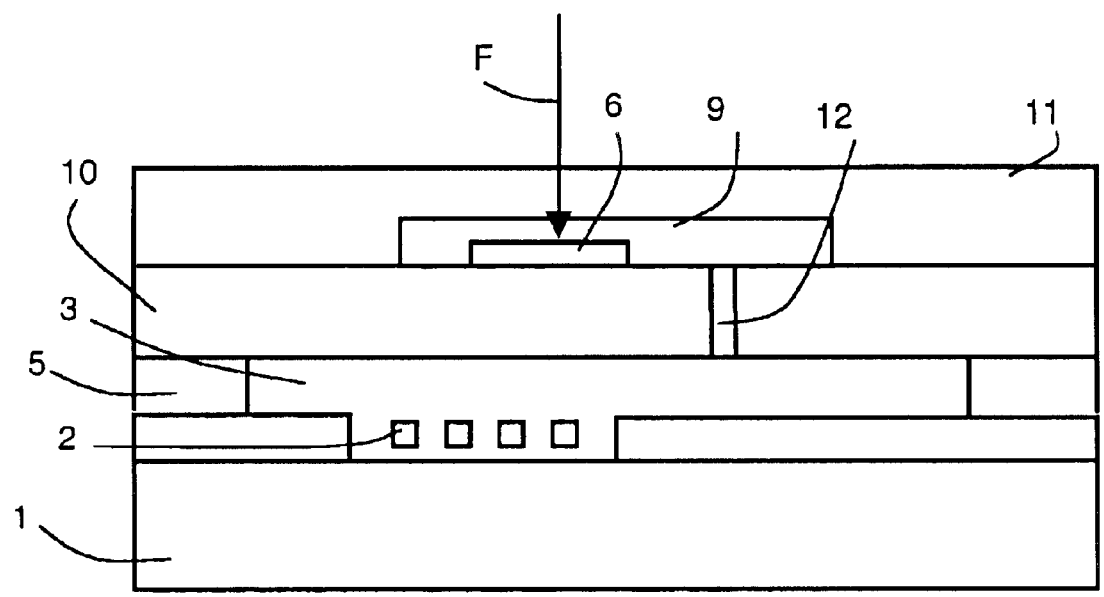

In the embodiment illustrated in FIGS. 3 and 4, the elements 6 are not arranged directly in the cavity 3 but in an additional cavity 9 formed in the cover 4. The cover 4 is for example formed by a first flat part 10 made of silicon whereon the elements 6 made of pyrotechnic material are arranged. A second part 11, arranged on the first part, comprises a recess defining, in conjunction with the first part 10, the additional cavity 9 of the cover wherein the elements 6 are placed. A micro-orifice 12 formed in the first part 10 of the cover joins the cavities 3 and 9 when the cover is fitted on the microstructure (FIG. 4). The micro-orifice 12 enables the gas generated by combustion of the elements 6 to flow into the cavity 3 while retaining any solid residues that may be produced when combustion of the elements 6 takes place.

As previously, ignition of the elements 6 can be performed selectively from a network of associated resistors or by means of laser beams (F) coming from outside the microstructure and directed selectively and/or sequentially towards the selected pyrotechnic elements through a zone of the cover 4 transparent at the wavelength of the laser beams. The zone of the cover 4 that is transparent at the wavelength of the laser beams can be formed by a glass constituting the whole of the second part 11.

Sealing of the cover 4 onto the base substrate 1, before the pressure in the cavity 3 is adjusted, can be performed by any suitable means, in particular by anodic or eutectic sealing, by soldering with a tin and lead alloy (SnPb), or by means of a polymer or meltable glass sealing seam.

All the embodiments described can be implemented by collective manufacturing of several microstructures according to the invention, for example on a single wafer of material forming the base substrate, for example made of silicon. Sealing is then preferably performed collectively, the microstructures obtained on the initial material wafer then being cut off in an additional step.

Sealing can be performed in a vacuum so as to guarantee good cleanliness of the cavity 3, the final pressure in the cavity being subsequently determined by selective ignition of the elements 6 made of pyrotechnic material. It is also possible to perform sealing in a non-zero pressure and to use ignition of the elements 6 only to complete the necessary quantity of gas. In a preferred embodiment, sealing being performed at atmospheric pressure, and therefore inexpensively, the gas released by combustion of elements 6 is essentially used to compensate the pressure drop due to cooling after sealing (to give an example, the pressure is divided approximately by two when the temperature decreases from 300° C. to the ambient temperature).

The gas generated by the elements 6 made of pyrotechnic material is preferably a neutral, non-corrosive gas. For example, the pyrotechnic material can be of the same type as that used in airbags, which is formed by a mixture of sodium nitride ($NaN_3$), potassium nitrate ($KNO_3$) and silica ($SiO_2$) and releases nitrogen ($N_2$) and solid residues $K_2NaSiO_4$. Numerous other pyrotechnic materials can also be used enabling other gases to be generated, in particular carbon monoxide (CO), carbon dioxide ($CO_2$), water vapour ($H_2O$) or hydrogen ($H_2$).

For example, a quantity of gas of 2 $mm^3$ designed to fill a cavity 3 of 2 mm×2 mm×0.5 mm can be released by combustion of about $2 \times 10^{-3}$ $mm^3$ of pyrotechnic material. The pyrotechnic material can for example be deposited in the form of a 100 µm×100 µm×200 µm micropellet, which is quite compatible with its arrangement in a microcavity of the microstructure or of the cover.

The invention can be used in particular for adjusting the damping factor of microstructures of an accelerometer, whereon the stray resonances and passband depend. For example, the passband of accelerometers of the type described in patents EP149,572, EP605,300 or EP605,303 filed by the applicant can be reduced by a factor of about three by adjusting the pressure inside the cavity 3 from 0.1 bar to 1 bar. The invention also enables the passband of accelerometers manufactured simultaneously on the same base substrate 1, using one and the same technological process, to be individually customized by adjusting the gas pressure in the corresponding cavity. This presents an appreciable economic advantage, enabling varying demands to be met simply and quickly. It can also be envisaged to reduce the passband of an accelerometer in the course of operation by selective ignition of one or more elements 6 made of pyrotechnic material, according to detection of certain events.

What is claimed is:

1. Integrated electromechanical microstructure comprising a base substrate and a cavity closed by a protective cover, microstructure comprising pressure adjusting means comprising at least one element made of pyrotechnic material, combustion whereof releases gas into the cavity so as to adjust the pressure in the cavity after the protective cover has been sealed.

2. Microstructure according to claim 1, wherein the element made of pyrotechnic material is deposited in the cavity.

3. Integrated electromechanical microstructure comprising a base substrate and a cavity closed by a protective cover, microstructure comprising pressure adjusting means comprising at least one element made of pyrotechnic material, combustion whereof releases gas into the cavity so as to adjust the pressure in the cavity after the protective cover has been sealed, wherein the element made of pyrotechnic material is deposited in an additional cavity formed in the protective cover, a micro-orifice of the protective cover joining the two cavities.

4. Microstructure according to claim 1, wherein the pyrotechnic material is deposited on an electrical resistor connected to external electrical terminals.

5. Microstructure according to claim 1, wherein the protective cover comprises a zone made of material transparent at a preset wavelength.

6. Microstructure according to claim 1, wherein the pyrotechnic material is a mixture of sodium nitride, potassium nitrate and silica.

7. Integrated electromechanical microstructure comprising a base substrate and a cavity closed by a protective cover, microstructure comprising pressure adjusting means comprising at least one element made of pyrotechnic material, combustion whereof releases gas into the cavity so as to adjust the pressure in the cavity after the protective cover has been sealed, wherein the pressure adjusting means comprise a plurality of elements made of pyrotechnic material able to be selectively ignited.

8. Process for adjusting the pressure in the cavity of a microstructure according to claim 1, comprising ignition of at least one element made of pyrotechnic material after the protective cover closing the cavity has been sealed.

9. Process according to claim 8 for adjusting the pressure in the cavity of a micro-structure wherein, the protective cover of the microstructure comprising a zone made of material transparent at a preset wavelength, ignition of the element made of pyrotechnic material is caused by a laser beam coming from outside the microstructure and directed towards the element made of pyrotechnic material through the transparent zone of the protective cover.

* * * * *